US006906952B2

(12) United States Patent
Yoshida et al.

(10) Patent No.: US 6,906,952 B2
(45) Date of Patent: Jun. 14, 2005

(54) NONVOLATILE SEMICONDUCTOR MEMORY DEVICE AND DATA WRITING METHOD THEREFOR

(75) Inventors: Keiichi Yoshida, Ome (JP); Shooji Kubono, Akishima (JP)

(73) Assignees: Renesas Technology Corp., Tokyo (JP); Hitachi ULSI Engineering Corp., Tokyo (JP)

(*) Notice: Subject to any disclaimer, the term of this patent is extended or adjusted under 35 U.S.C. 154(b) by 22 days.

(21) Appl. No.: 10/394,050

(22) Filed: Mar. 24, 2003

(65) Prior Publication Data

US 2003/0185056 A1 Oct. 2, 2003

Related U.S. Application Data

(63) Continuation of application No. 09/984,833, filed on Oct. 31, 2001, now abandoned, which is a continuation of application No. 09/679,867, filed on Oct. 5, 2000, now Pat. No. 6,320,785, which is a continuation of application No. 09/342,223, filed on Jun. 29, 1999, now Pat. No. 6,525,960, which is a continuation of application No. 08/890,396, filed on Jul. 9, 1997, now Pat. No. 5,959,882.

(30) Foreign Application Priority Data

Jul. 10, 1996 (JP) ............................................. 8-180859

(51) Int. Cl.[7] .............................................. G11C 16/04
(52) U.S. Cl. ........................... 365/185.03; 365/185.01; 365/191; 365/233
(58) Field of Search .................. 365/185.01, 185.03 O, 365/189.01, 191, 233

(56) References Cited

U.S. PATENT DOCUMENTS 4,435,786 A 3/1984 Tickle ......................... 365/154

4,707,809 A * 11/1987 Ando ..................... 365/189.05

(Continued)

FOREIGN PATENT DOCUMENTS

| JP | 59-121696 | 7/1984 | |
|---|---|---|---|
| JP | 62-6493 | 1/1987 | |
| JP | 1-134793 | 5/1989 | |
| JP | 3-59886 | 3/1991 | |
| JP | 4-57294 | 2/1992 | |
| JP | 4-238196 | 8/1992 | |
| JP | 7-93979 | 4/1995 | |
| JP | 9-091971 | 9/1995 | |
| JP | 08087876 A * | 4/1996 | ............ G11C/5/00 |

OTHER PUBLICATIONS

IEEE International Solid–State Circuits Conference, "A 3.3V 128 Mb Multi–Level NAND Flash Memory for Mass Storage Applications", T. Jung, et al., Feb. 8, 1996, (7 pp.).

1994 Symposium on VLSI Circuits Digest of Technical Papers, "High–Speed Programming and Program–Verify Methods Suitable for Low–Voltage Flash Memories", T. Tanaka, et al., pp. 61–62.

IEEE Journal of Solid–State Circuits, vol. 31, No. 11, "A 117 mm[2] 3.3–V Only 128–Mb Multilevel NAND Flash Memory for Mass Storage Applications", T. Jung, et al., Nov. 1996, pp. 1575–1583.

Primary Examiner—Van Thu Nguyen
(74) Attorney, Agent, or Firm—Antonelli, Terry, Stout & Kraus, LLP

(57) ABSTRACT

In a nonvolatile semiconductor memory device wherein a plurality of threshold voltages are set so as to store multi-valued information in one memory cell, data is first written into the memory cell whose threshold voltage is the lowest as a written state from the erase level, and data is successively written into memory cells whose threshold voltages are higher.

23 Claims, 11 Drawing Sheets

U.S. PATENT DOCUMENTS

| | | | |
|---|---|---|---|
| 4,860,258 A | 8/1989 | Fruhauf et al. | 365/194 |
| 4,964,079 A | 10/1990 | Devin | 365/168 |
| 5,022,001 A | 6/1991 | Kowalski et al. | 365/185.25 |
| 5,163,021 A | 11/1992 | Mehrotra et al. | 365/185 |
| 5,200,920 A | 4/1993 | Norman et al. | 365/185 |
| 5,365,486 A | 11/1994 | Schreck | 365/222 |
| 5,440,505 A | 8/1995 | Fazio et al. | 365/45 |
| 5,450,363 A | 9/1995 | Christopherson et al. | 365/205 |
| 5,487,036 A | 1/1996 | Akaogi et al. | 365/189.09 |
| 5,539,688 A | 7/1996 | Yiu et al. | 365/185.14 |
| 5,544,099 A | 8/1996 | Hara | 365/185.19 |
| 5,555,204 A | 9/1996 | Endoh et al. | 365/189.01 |
| 5,566,125 A | 10/1996 | Fazio et al. | 365/45 |
| 5,570,315 A | 10/1996 | Tanaka et al. | 365/185.22 |
| 5,602,789 A | 2/1997 | Endoh et al. | 365/201 |
| 5,615,153 A | 3/1997 | Yiu et al. | 365/185.19 |
| 5,621,682 A | 4/1997 | Tanzawa et al. | 365/185.03 |
| 5,625,590 A * | 4/1997 | Choi et al. | 365/185.17 |
| 5,652,719 A | 7/1997 | Tanaka et al. | 365/185.17 |
| 5,675,537 A | 10/1997 | Bill et al. | 365/185.22 |
| 5,677,868 A | 10/1997 | Takahashi et al. | 365/185 |
| 5,677,869 A | 10/1997 | Fazio et al. | 365/185.03 |
| 5,687,114 A | 11/1997 | Khan | 365/185.03 |
| 5,694,357 A | 12/1997 | Mori | 365/185.03 |
| 5,748,533 A | 5/1998 | Dunlap et al. | 365/185.19 |
| 5,751,634 A | 5/1998 | Itoh | 365/185.17 |
| 5,754,469 A | 5/1998 | Hung et al. | 365/185.03 |
| 5,754,475 A | 5/1998 | Bill et al. | 365/185.25 |
| 5,757,699 A | 5/1998 | Takeshima et al. | 365/185.24 |
| 5,761,150 A * | 6/1998 | Yukutake et al. | 365/233 |
| 5,768,188 A | 6/1998 | Park et al. | 365/185.03 |
| 5,768,191 A | 6/1998 | Choi et al. | 365/185.22 |
| 5,768,193 A | 6/1998 | Lee et al. | 365/185.25 |
| 5,796,652 A | 8/1998 | Takeshima et al. | 365/185.03 |
| 5,825,690 A | 10/1998 | Saitoh | 365/185.22 |
| 5,864,569 A | 1/1999 | Roohparvar | 365/185.09 |
| 5,870,218 A | 2/1999 | Jyouno et al. | 365/185.03 |
| 5,889,698 A | 3/1999 | Miwa et al. | 365/185.03 |
| 5,960,458 A * | 9/1999 | Kametani | |
| 6,166,950 A | 12/2000 | Yamada et al. | 365/185.03 |

* cited by examiner

FIG. 1

| | INITIAL STATE | WRITE #1 |
|---|---|---|
| CHANGE IN Vth DISTRIBUTION | FREQUENCY: "11" at 4.0V Vth | FREQUENCY: "01" ← "11", Vwv1=1.5V Vth |
| MEMORY BIAS CONDITIONS | 0V, b1(11) b2(11) b3(11) b4(11) / (01)(00)(10)(11) | 5V, Vwg1=−11V, b1(01) b2(11) b3(11) b4(11) / (01)(00)(10)(11) |
| WRITE DATA | 01  00  10  11 | 01  00  10  11 |
| MEMORY DATA | 11  11  11  11 | 01  11  11  11 |
| DISTURBANCE | −  −  −  − | 0  1  1  1 |
| | WRITE #2 | WRITE #3 |
| CHANGE IN Vth DISTRIBUTION | FREQUENCY: "01" "00" "11", Vwv2=2.5V Vth | FREQUENCY: "01" "00" "10" "11", Vwv3=3.3V Vth |
| MEMORY BIAS CONDITIONS | Vwg2=−10.5V, 5V, b1(01) b2(00) b3(11) b4(11) / (01)(00)(10)(11) | Vwg3=−10V, 5V, b1(01) b2(00) b3(10) b4(11) / (01)(00)(10)(11) |
| WRITE DATA | 01  00  10  11 | 01  00  10  11 |
| MEMORY DATA | 01  00  11  11 | 01  00  10  11 |
| DISTURBANCE | 1  0  2  2 | 2  1  0  3 |

FIG. 12 PRIOR ART

| | INITIAL STATE | WRITE #1 |
|---|---|---|
| CHANGE IN Vth DISTRIBUTION | FREQUENCY "11" at 4.0V Vth | FREQUENCY "10" "11" at Vwv3=3.3V Vth |
| MEMORY BIAS CONDITIONS | 0V — b1(11) b2(11) b3(11) b4(11) / (01) (00) (10) (11) | Vwg1=-11V, 5V b1(10), 5V b2(10), 5V b3(10), b4(11) / (01) (00) (10) (11) |
| WRITE DATA | 01 00 10 11 | 01 00 10 11 |
| MEMORY DATA | 11 11 11 11 | 10 10 10 11 |
| DISTURBANCE | – – – – | – – 0 1 |

| | WRITE #2 | WRITE #3 |
|---|---|---|
| CHANGE IN Vth DISTRIBUTION | FREQUENCY "00" "10" "11" at Vwv2=2.5V Vth | FREQUENCY "01" "00" "10" "11" at Vwv1=1.5V Vth |
| MEMORY BIAS CONDITIONS | Vwg=-11V, 5V b1(00), 5V b2(00), b3(10), b4(11) / (01) (00) (10) (11) | Vwg=-11V, 5V b1(01), b2(00), b3(10), b4(11) / (01) (00) (10) (11) |
| WRITE DATA | 01 00 10 11 | 01 00 10 11 |
| MEMORY DATA | 00 00 10 11 | 01 00 10 11 |
| DISTURBANCE | – 0 1 2 | 0 1 2 3 |

NONVOLATILE SEMICONDUCTOR MEMORY DEVICE AND DATA WRITING METHOD THEREFOR

SPECIFICATION

This application is a continuation of U.S. application Ser. No. 09/984,833 now abandoned, filed Oct. 31, 2001, which, in turn is a continuation of U.S. application Ser. No. 09/679,867, filed Oct. 5, 2000, now U.S. Pat. No. 6,320,785; which is a continuation of U.S. application Ser. No. 09/342,223, filed Jun. 29, 1999, now U.S. Pat. No. 6,525,960; and which, in turn, is a continuation of U.S. application Ser. No. 08/890,396, filed Jul. 9, 1997, and now U.S. Pat. No. 5,959,882; and the entire disclosures of which are incorporated herein by reference.

BACKGROUND OF THE INVENTION

The present invention relates to a semiconductor memory device, and to a technique which is particularly effective when applied to a memory system for multivalued information in a nonvolatile semiconductor memory device. By way of example, the technique is effective when utilized for a nonvolatile memory device (hereinafter referred to simply as a flash memory) in which a plurality of pieces of stored information can be electrically erased all at once.

In a flash memory, nonvolatile memory elements each having a control gate and a floating gate are used as memory cells, and each memory cell can be constructed of a single transistor. In such a flash memory, when a write operation is executed, as illustrated in FIG. 10, the drain region of the nonvolatile memory element is set at, for example, about 5 V (volts), while a word line with the control gate CG connected thereto is set at, for example, about −11 V, whereby electric charges are extracted from the floating gate FG by means of a tunnel current so as to render the threshold voltage of the memory element low (logical value "0"). When an erase operation is executed, as illustrated in FIG. 11, a well region, the drain region and a source region are set at about −4 V, by way of example, while the control gate CG is set at a high voltage, such as 12 V, whereby negative charges are injected into the floating gate FG by the generation of a tunnel current so as to render the threshold voltage high (logical value "1"). Thus, data of 1 (one) bit is stored in one memory cell.

There has been proposed the concept of a so-called "multivalued" memory wherein data of 2 or more bits is stored in one memory cell for the purpose of enlarging the memory capacity. An invention concerning such a multivalued memory is disclosed in, for example, PCT/JP95/02260.

SUMMARY OF THE INVENTION

In the multivalued memory disclosed in PCT/JP95/02260, data is written in three stages, as shown in FIG. 12. More specifically, from the starting point of an erase level (threshold voltage of about 5 V), a memory cell whose threshold voltage is nearest to the erase level is first subjected to a write operation, and memory cells whose threshold voltages are farther from the erase level are thereafter subjected to a write operation. This is intended to shorten the time period taken to write multivalued data. In a write operation in a flash memory, however, a high voltage is applied not only to the control gate of the selected memory cell, but also to the control gates of nonselected memory cells which are coupled with a word line common to that of the selected memory cell. As is known, accordingly, each of the nonselected memory cells is brought into a weak written (disturbed) state, so that the threshold voltage thereof may fluctuate to change stored data. This phenomenon is known as word line disturbance.

Besides, the inventors have found that the memory cell whose threshold voltage is nearer to the erase level is more susceptible to the fluctuation of the threshold voltage attributed to the word line disturbance, than the memory cell whose threshold voltage is farther. It is considered that this is because the initial threshold voltage of each memory cell at the time of manufacture of a memory chip is much lower than the erase level, and the memory cells have a tendency of reverting to their initial threshold voltage when subjected to a disturbance.

However, it has been found that the data writing system disclosed in PCT/JP95/02260 is subject to a problem in that the fluctuations of the threshold voltages attributed to word line disturbance are great because the write operation is performed from the memory cell of a threshold voltage nearest to the erase level, as compared to the memory cells having more distant threshold voltages. More specifically, the data writing method, as shown in FIG. 12, has a drawback in that the memory cell (of data "01") having a threshold voltage (lower than 1.5 V) farthest from the erase level does not undergo word line disturbance even once, whereas the memory cell (of data "10") having a threshold voltage (about 3.2 V) nearest to the erase level, being most susceptible to the word line disturbance, undergoes the disturbance twice on the average.

Further, it has been found that the data writing method disclosed in PCT/JP95/02260 has a drawback in that, since a write pulse is fed to all the memory cells whose threshold voltages are to be shifted in the write operation of the first stage, the peak current in the write operation increases and the average power consumption also increases.

An object of the present invention is to provide a multivalued memory type nonvolatile semiconductor memory device wherein the fluctuations in the threshold voltages of memory cells attributed to word line disturbance can be minimized.

Another object of the present invention is to provide a nonvolatile semiconductor memory device whose peak current and average power consumption in a write operation can be decreased.

The above and other objects and novel features of the present invention will become more apparent from the description of this specification taken in conjunction with the accompanying drawings.

A typical aspect of the present invention will be briefly outlined below.

In a nonvolatile semiconductor memory device wherein a plurality of threshold voltages are determined so as to store multivalued information in one memory cell, data is first written into a memory cell whose threshold voltage is the farthest from the erase level, and data is thereafter written into memory cells whose threshold voltages are nearer to the erase level, in succession. In other words, with the erase level used as a written state, data is first written into a memory cell having the lowest threshold voltage, and data is thereafter successively written into memory cells having higher threshold voltages.

Thus, the number of word line disturbances which affect the memory cell having a threshold voltage nearest to the erase level and being most influenced by word line disturbance can be decreased, and the fluctuation of the threshold voltages attributed to word line disturbance can be minimized.

Moreover, owing to this feature, the number of data lines which must be precharged by one writing operation and the total number of data lines which must be precharged from the start of a write operation to the end thereof can be made smaller than conventional, thereby to reduce the peak current and average power consumption in a write operation.

BRIEF DESCRIPTION OF THE DRAWINGS

FIG. 1 is an explanatory diagram showing the outline of a data writing method for a multivalued flash memory according to the present invention;

FIG. 12 is an explanatory diagram showing the outline of a data writing method for a multivalued flash memory according to a prior application.

DESCRIPTION OF THE PREFERRED EMBODIMENTS

Now, various embodiments of the present invention will be described with reference to the drawings in relation to the case where the invention is applied to a flash memory which is capable of storing a quaternary value in one memory cell.

FIG. 1 illustrates the data writing sequence of a flash memory in one embodiment of the present invention. In this embodiment, all the memory cells thereof are brought into the threshold voltage region (the threshold voltages are at least 4 V and the stored data is "11") of the erase level prior to the writing operation. Subsequently, as shown in FIG. 1, data is written into the memory cell (stored data is "01") whose threshold voltage region (the threshold voltage is higher than 0 V and not higher than 1.4 V) is the farthest (lowest) from the erase level. Thereafter, the data is written into the memory cell (stored data is "00" whose threshold voltage region (the threshold voltage is not lower than 1.6 V and not higher than 2.4 V) is the second farthest (second lowest) from the erase level. Lastly, the data is written into the memory cell (stored data is "10") whose threshold voltage region (the threshold voltage is not lower than 2.6 V and not higher than 3.2 V) is the nearest to the erase level.

Thus, the number of word line disturbances affecting the memory cell (the stored data is "01"), whose threshold voltage region is the farthest from the erase level and is little affected by the word line disturbance, becomes 2, but the number of the word line disturbances affecting the memory cell (the stored data "10"), whose threshold voltage region is the nearest to the erase level and is most affected by the word line disturbance, can be reduced to zero. Accordingly, compared with the method shown in FIG. 12 in which data is written from the memory cell nearest to the erase level, the method of this embodiment can suppress to smaller values the fluctuation of the threshold voltages attributed to word line disturbance.

Figure 2:
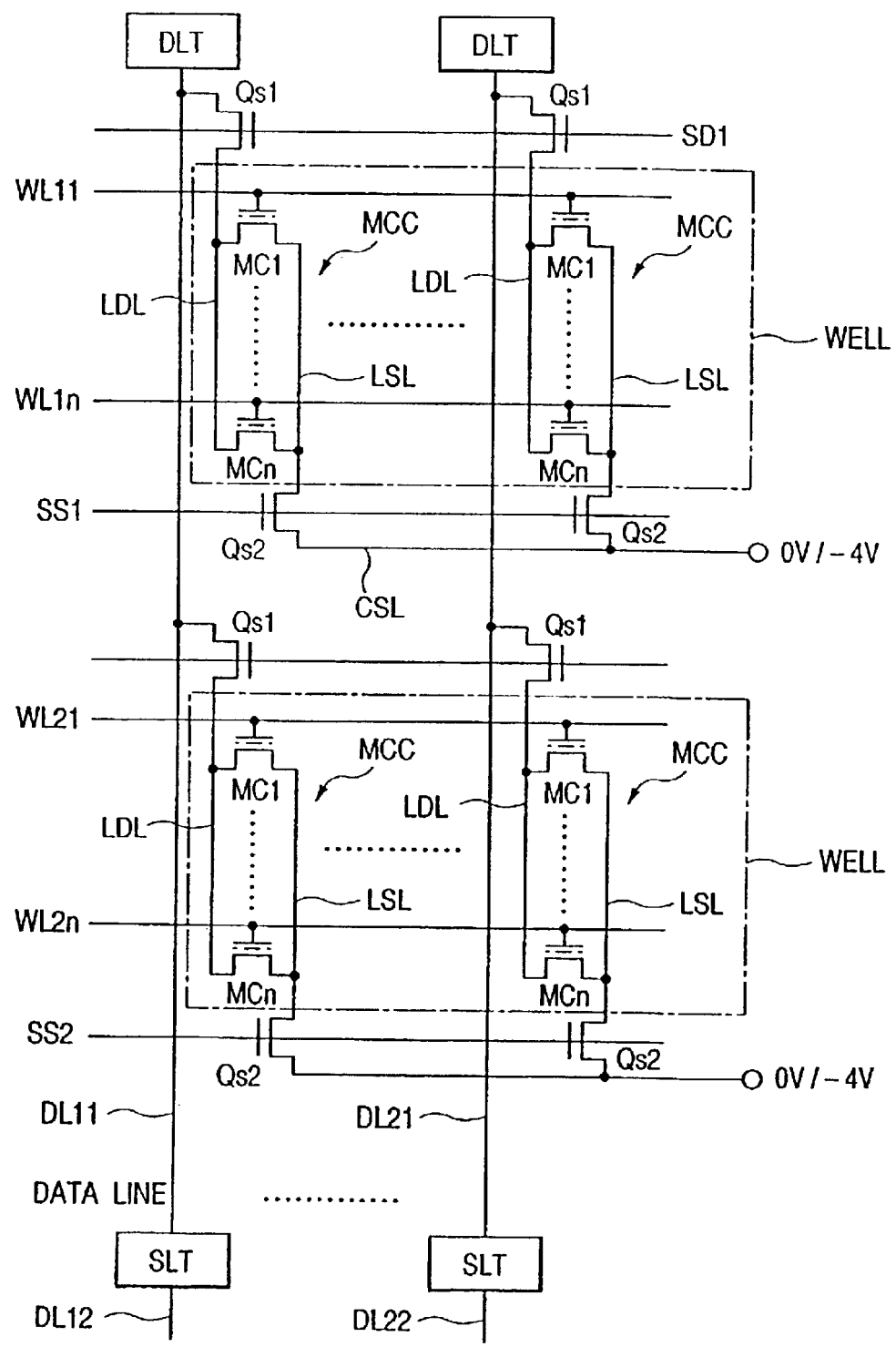
FIG. 2 is a circuit diagram showing an example of the construction of a memory array of a multivalued flash memory according to the present invention.

FIG. 2 illustrates a practical example of a memory array 10, which will be explained later with reference to FIG. 9. The memory array 10 of this embodiment comprises two memory mats, one (the upper one) of which is illustrated in FIG. 2. As seen from the drawing, each memory mat comprises memory cell columns MCC disposed in the row direction (in the direction of word lines WL) and in the column direction (in the direction of data lines DL), and each of which includes n parallelly-connected memory cells (MOSFETs, each having a floating gate) MC1-MCn that are arrayed in the column direction and that have their sources and drains connected in common. In each memory cell column MCC, the drains and sources of the n memory cells MC1-MCn are respectively connected to a common local drain line LDL formed of a diffused layer and to a common local source line LSL formed of a diffused layer. The local drain line LDL is connected through a switching MOSFET Qs1 to the data line DL which is formed of a metallic interconnection layer made of, for example, aluminum. The local source line LSL is connected through a switching MOSFET Qs2 to a common source line CSL, which also is formed of a metallic interconnection layer made of, for example, aluminum, and which is fed with the ground potential or a negative voltage.

Those of the plurality of memory cell columns MCC which are disposed in the word line direction are formed within the same well region WELL on a semiconductor substrate. In the data erasing operation of the flash memory, the negative voltage of, e.g., −4 V is applied to the well region, and a voltage of, e.g., 12 V is applied to the word lines associated with the common well region, whereby the all-at-a-time erasure of the flash memory is realized. By the way, in the data erasing operation, all the switching MOSFETs Qs1 and Qs2 formed in the common well region are brought into ON states so as to apply the negative voltage of −4 V to the sources and drains of the memory cells.

On the other hand, in the data writing operation of the flash memory, a negative voltage of, e.g., −11 V is applied to the word line to which a selected one of the memory cells is connected, the data line DL corresponding to the selected memory cell is set at a potential of, e.g., 5 V, and the switching MOSFET Qs1 on the local drain line LDL to which the selected memory cell is connected is brought into an ON state so as to apply the voltage of 5 V to the drain of the selected memory cell. In this case, however, the switching MOSFET Qs2 on the pertinent local source line LSL is held in an OFF state. Further, in the data reading operation of the flash memory, a voltage of, e.g., 1.5 V, 2.5 V or 3.3 V is applied to the word line to which the selected memory cell is connected, the data line DL corresponding to the selected memory cell is precharged to a potential of, e.g., 1

V, and the switching MOSFET Qs1 on the local drain line LDL to which the selected memory cell is connected is brought into the ON state. At this time, the switching MOSFET Qs2 on the local source line LSL is brought into the ON state and the ground potential of 0 V is applied thereto.

Connected to one end of each data line DL (on the center side of the memory array) is a sense latch circuit SLT which detects the level of the data line in the read operation and which impresses a potential corresponding to write data in the write operation, while the other end of each data line DL is connected to a data latch circuit DLT which holds the write data and read data. Since the memory array of this embodiment is configured of two mats, a memory mat similar to the one described above is also arranged on the opposite side to the sense latch circuits SLT, that is, on the bottom side of the drawing, and respective data lines DL in the lower memory mat are connected to the other input/output terminals of the corresponding sense latch circuits SLT in the upper memory mat.

Figure 3:
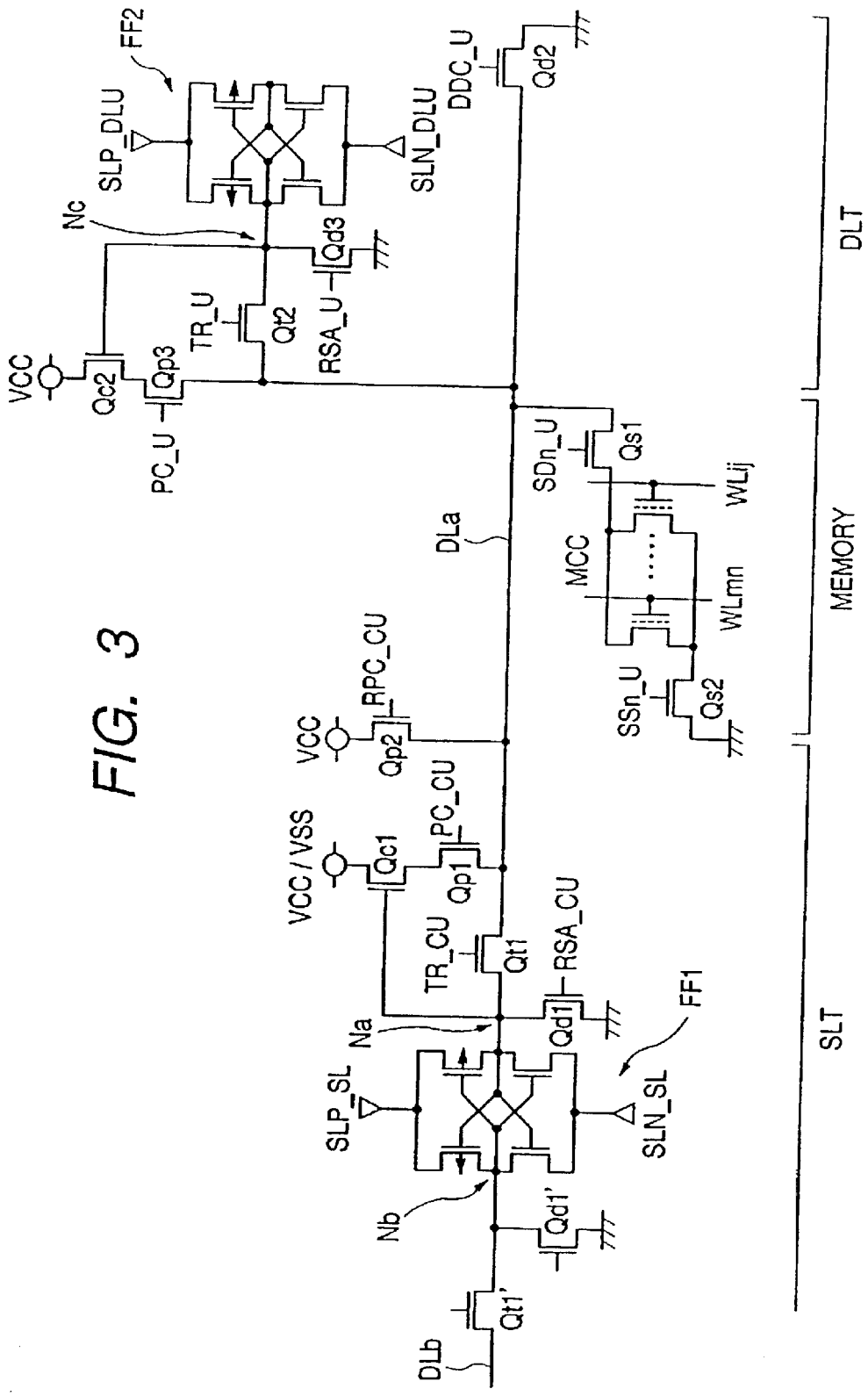
FIG. 3 is a circuit diagram showing practical examples of a sense latch circuit (SLT) and a data latch circuit (DLT)

FIG. 3 illustrates examples of the specific circuits of the sense latch circuit SLT and the data latch circuit DLT. Since the circuit of the memory array is symmetric with respect to the sense latch circuits SLT, a part of the circuit in relation to only one data line DL included in one memory mat is shown. In addition, only one of the memory cell columns MCC connected to the data line DL is shown for convenience, but actually the plurality of memory cell columns MCC are connected. As shown in the drawing, the sense latch circuit SLT includes a flip-flop circuit FF1 in which the input/output terminals of two CMOS (complementary MOS) inverters each consisting of a P-channel MOSFET and an N-channel MOSFET are cross-coupled to each other. One end of the data line DLa within one memory mat is connected to one input/output node Na of the sense latch circuit SLT through a data transfer MOSFET Qt1. Similarly, one end of the data line DLb within the other memory mat is connected to the other input/output node Nb of the sense latch circuit SLT through a data transfer MOSFET Qt1'.

Further, discharging MOSFETs Qd1 and Qd1' are respectively connected to the input/output nodes Na and Nb of the sense latch circuit SLT, and a discharging MOSFET Qd2 is connected also to the other end of the data line DLa. The precharging MOSFETs Qp1 and Qp2 are connected to each data line DL, and one Qp1 of them is connected through another MOSFET Qc1 to a terminal which is fed with a supply voltage Vcc or the ground potential Vss. Write data can be input from a data conversion circuit, which will be described later, to the input/output nodes Na and Nb of the sense latch circuit SLT through a common input/output line not shown.

Similarly to the sense latch circuit SLT, the data latch circuit DLT includes a flip-flop circuit FF2 in which the input/output terminals of two CMOS inverters each consisting of a P-channel MOSFET and an N-channel MOSFET are cross-coupled to each other. The data line DLa within the memory mat is connected to one input/output node Nc of the data latch circuit DLT through a data transfer MOSFET Qt2. A discharging MOSFET Qd3 is connected to the input/output node Nc of the data latch circuit DLT, and MOSFETs Qp3 and Qc2 which are turned on/off, depending upon the level of a precharge signal PC_U and the potential of the input/output node Nc, are connected in series between the data line DLa and the supply voltage Vcc.

Further, the write data can be input from the data conversion circuit, which will be described later, to the input/output node Nc of the data latch circuit DLT through the common input/output line not shown. Although not depicted in FIG. 3, the data latch circuit DLT constructed of a flip-flop circuit for holding the write data transmitted from the data conversion circuit is arranged also at the other end of the data line DLb which is connected to the input/output node Nb of the sense latch circuit SLT.

Figure 4:
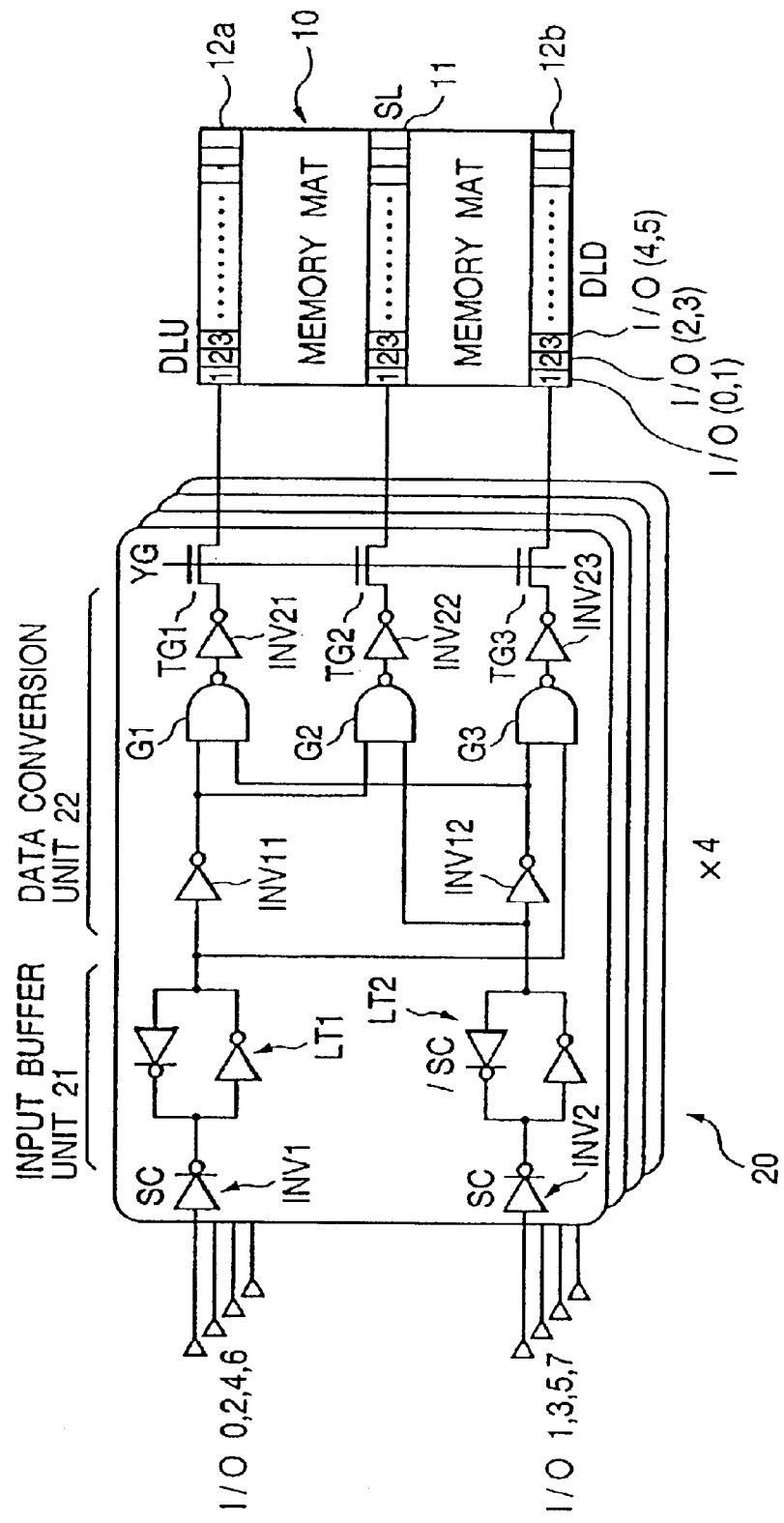
FIG. 4 is a logic circuit diagram showing an embodiment of a data conversion circuit according to the present invention, which converts write data of 2 bits into quaternary data.

FIG. 4 illustrates the data conversion circuits 20, by which externally inputted data to be stored is converted into multivalued data to be stored in the memory cells, and the relations of the data conversion circuits 20 with a sense latch array 11 and data latch arrays 12a and 12b, which are included in the memory array 10. Each data conversion circuit 20 is constituted by an input buffer unit 21 and a data conversion unit 22, and data of 8 bits can be input in parallel in pairs of 2 bits. One set of an input buffer unit 21 and a data conversion unit 22 is shown in detail in FIG. 4, and will be described below.

The input buffer unit 21 of one data conversion circuit 20 includes two clocked inverters INV1 and INV2, and two latch circuits LT1 and LT2. The data conversion unit 22 includes inverters INV11 and INV12, which are respectively connected to the relevant latch circuits LT1 and LT2, three NAND gate circuits G1, G2 and G3, which receive the outputs of the two inverters INV11 and INV12 and the outputs of the latch circuits LT1 and LT2 as input signals, inverters INV21, INV22 and INV23, which invert the outputs of the respective gate circuits G1, G2 and G3, and transfer gates TG1, TG2 and TG3, which are made up of MOSFETs connected to the respective inverters TG1, TG2 and TG3. Thus, the input data of 2 bits is converted into data of 3 bits, and data of 3 bits×4 is outputted as a whole.

Table 1 below shows an example of data conversion by the data conversion circuit 20.

TABLE 1

| Write Data | I/O 0 | I/O 1 | DLU [1] | SL [1] | DLD [1] |
| --- | --- | --- | --- | --- | --- |
| 01 | 0 | 1 | 0 | 1 | 0 |
| 00 | 0 | 0 | 1 | 0 | 0 |
| 10 | 1 | 0 | 0 | 0 | 1 |
| 11 | 1 | 1 | 0 | 0 | 0 |

As listed in Table 1, write data "01" is converted into 3-bit data "010", write data "00" is converted into 3-bit data "100", write data "10"into 3-bit data "001", and write data "11"is converted into 3-bit data "000". After the conversion, the data is written into only the memory cell which corresponds to the bit corresponding to "1", and no data is written into the memory cells which correspond to the bits corresponding to "0".

Data of 3 bits, obtained by converting two bits out of the 8 bits of the write data, which is received by the data conversion circuit 20 and supplied through the external terminals I/O 0 and I/O 1, are respectively transferred to and held in the first latch circuits (DLU1, SL1 and DLD1) of the data latch arrays 12a and 12b which are arranged at both ends of the memory array 10 (at the top and bottom of FIG. 4) and the sense latch array 11 which is arranged at the center of the memory array 10. Data of 3 bits, obtained by converting two bits of the 8-bit write data supplied through the external terminals I/O 2 and I/O 3, are respectively transferred to and held in the second latch circuits (DLU2, SL2 and DLD2) of the data latch arrays 12a and 12b of the memory array 10 and the sense latch array 11 thereof.

Similarly to the above, 3-bit data, obtained by converting the two bits of the 8-bit write data supplied through the external terminals I/O 4 and I/O 5, are respectively transferred to and held in the third latch circuits (DLU3, SL3 and DLD3) of the data latch arrays 12a and 12b and the sense latch array 11. Also, 3-bit data, obtained by converting the two bits of the 8-bit supplied through the external terminals I/O 6 and I/O 7, are respectively transferred to and held in the fourth latch circuits of the data latch arrays 12a and 12b and the sense latch array 11. The 8-bit write data subsequently input are respectively converted by the data conversion circuits 20, and the resulting 3-bit data are respectively transferred to and held in the fifth-eighth latch circuits of the data latch arrays 12a and 12b and the sense latch array 11.

When all the write data has been stored in all the latch circuits of the data latch arrays 12a and 12b and the sense latch array 11 by repeating the operations described above, a control circuit which will be described later, and which is included in the memory, starts a write sequence in which the data held in the sense latch array 11 is first written, the data held in the data latch array 12a is subsequently written, and the data held in the data latch array 12b is thereafter written. Incidentally, the control circuit is so constructed as to perform controls in compliance with commands which are input from, e.g., a CPU outside the flash memory.

Figure 5:
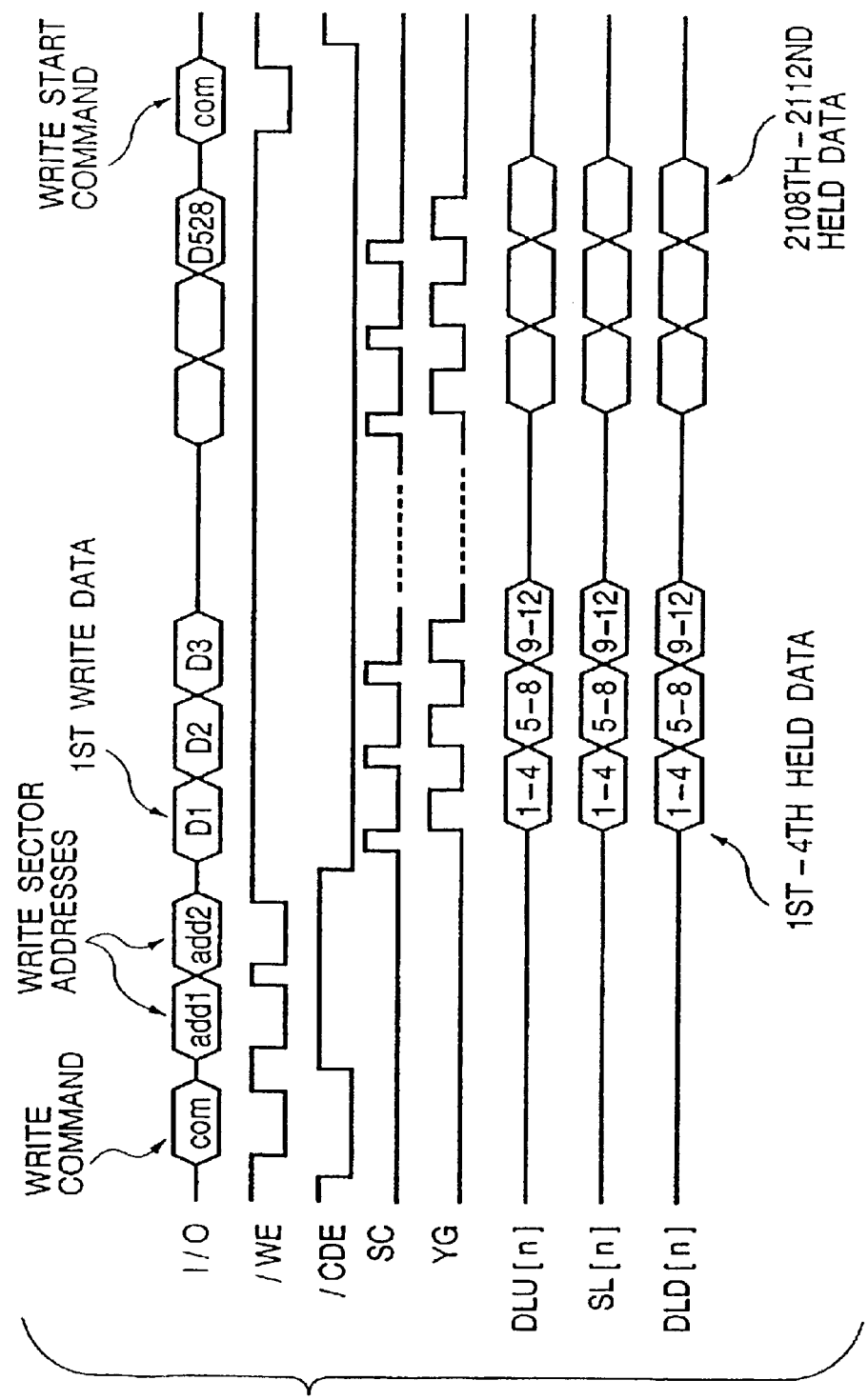
FIG. 5 is a timing chart showing the data input timings of the write operation of the multivalued flash memory of the embodiment.

FIG. 5 illustrates the timings of a data writing operation. As seen from the chart, in the data writing operation, a write command commanding the control circuit to write data is first input, and the addresses (sector addresses) add1 and add2 of the word lines to which the memory cells where the data is written are coupled are subsequently input. The write command and the addresses are inputted in synchronism with the trailing edge of the pulse of a write enable signal/WE. In this case, the command and the addresses are distinguished by a control signal (command data enable signal)/CDE which is simultaneously input. More specifically, the low level of the signal/CDE indicates that the command or data is being input, while the high level thereof signifies that the addresses are being input.

The addresses add1 and add2 are followed by the first write data D1 of 8 bits to be stored in one sector (the memory cells connected to one word line), and the 8-bit data D1 is received by the four input buffer units 21 in synchronism with a clock SC. Subsequently, the transfer gates TG1–TG3 are turned on by a gate control signal YG after the data conversion by the data conversion circuits 20, and the write data of 3 bits×4 are successively transferred to and held in the data latch arrays 12a and 12b and the sense latch array 11. Thereafter, the input write data D2, D3, . . . , D528 received in units of eight bits are sequentially converted and the resulting data is stored in the sense latch array 11 and the data latch arrays 12a and 12b. When the transfer of the write data for one sector ends, a write start command for starting the write operation is input from outside the flash memory and is received, and the command is decoded to execute the write sequence. Thus, the data for one sector is simultaneously written.

Figure 6:
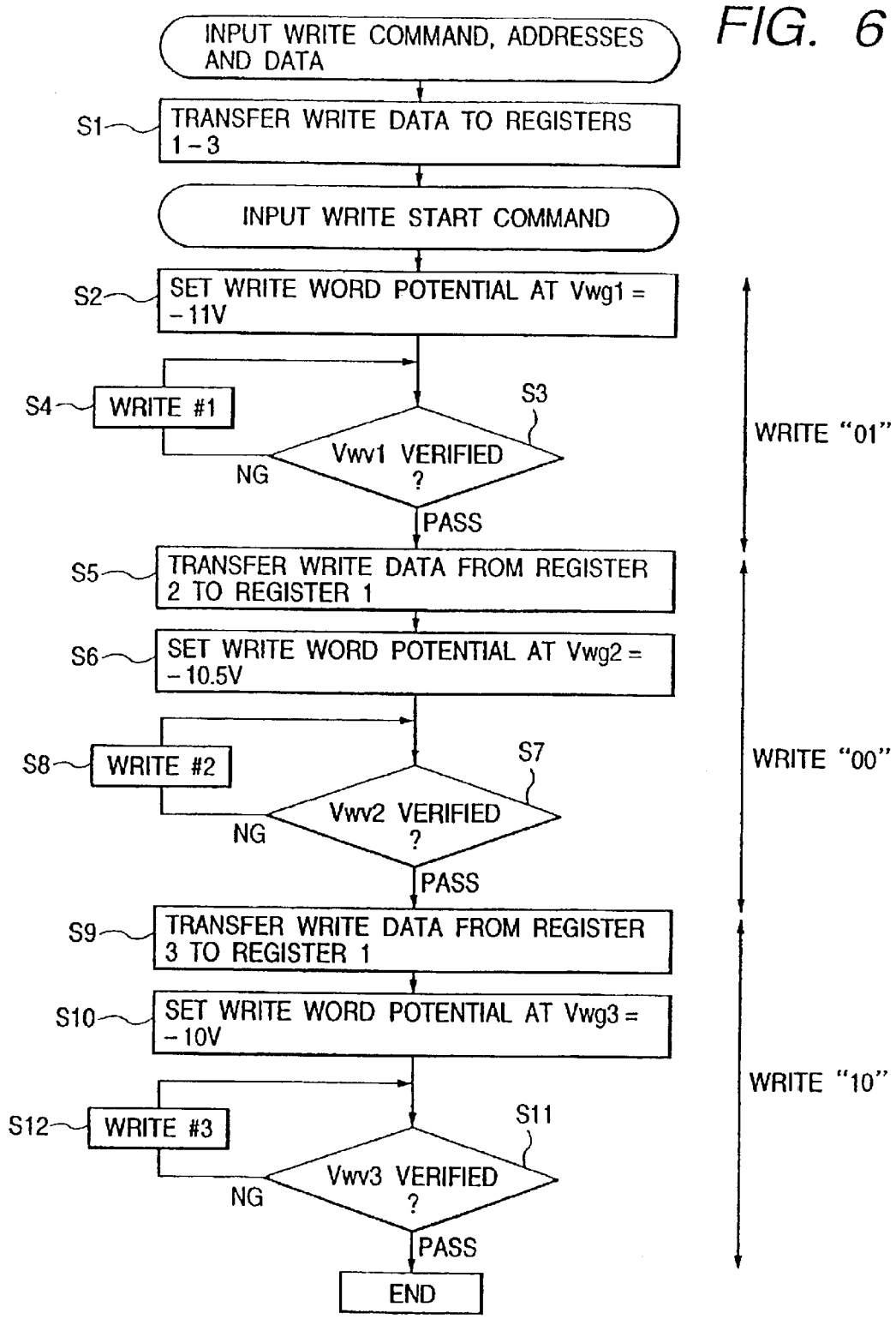
FIG. 6 is a flowchart showing the write procedure of the multivalued flash memory of the embodiment.

In the memory array 10, the memory elements connected to the data lines where the data stored in the sense latch array 11 and the data latch arrays 12a and 12b are "1" are subjected to a write operation, in other words, to impression of write pulses. In this way, the threshold voltages of the individual memory elements are shifted as shown in FIG. 1, and quaternary data can be written into one memory cell. FIG. 6 illustrates the write control procedure.

Referring to FIG. 6, after a write command, write sector addresses and write data are inputted, and, at the first step S1 (write data are transferred to latches 1–3), the data converted by the data conversion circuit 20 is transferred to the sense latch array 11 and the data latch arrays 12a and 12b. The second and later steps S2, . . . are a control sequence which is started by the input of the write start command.

In the control sequence, first, each word line selected by decoding the write address already received is set at a potential of, e.g., −11 V (step S2). Simultaneously, the transfer MOSFETs Qt1 on the data lines are turned on, and the data lines having the data "1" are set at a potential of, e.g., 5 V in accordance with data held in the sense latch array 11 at this time, thereby to write the data. Subsequently, the data lines are precharged to a potential of, e.g., 1 V, and the selected word line is set at a voltage of, e.g., 1.5 V, thereby to read the data for verification. At this time, the data read out of each memory cell, in which the write operation is performed normally, to the sense latch array 11 changes to "0". It is therefore judged whether or not all the data held in the sense latch array 11 are "0" (step S3). When the data "1" remains at any bit of the sense latch array 11, only the memory cells having undergone the write operation are subjected to a write operation again by the use of the data held in the sense latch array 11 (step S4).

When, as a result of the verification judgment, all the data of the sense latch array 11 have become "0", the write operation proceeds to the step S5, at which data held in the data latch array 12a is transferred to the sense latch array 11. Then, the selected word line is set at a potential of, e.g., −10.5 V which is somewhat lower than that at the step S2 (step S6). Subsequently, the transferred data is written on the basis of the data held in the sense latch array 11. Thereafter, the data is read for verification by setting the selected word line at a voltage of, e.g., 2.5 V, to judge whether or not all the data held in the sense latch array 11 is "0" (step S7). When the data "1" remains at any bit of the sense latch array 11, only the memory cells not having undergone the write operation are subjected to the write operation again by the use of the data held in the sense latch array 11 (step S8).

When, as a result of the verification judgment, all the data of the sense latch array 11 have become "0", the write operation proceeds to the step S9, at which data held in the data latch array 12b is transferred to the sense latch array 11. Then, the selected word line is set at a potential of, e.g., −10 V which is still somewhat lower than that at the step S6 (step S10). Subsequently, the transferred data is written on the basis of the data held in the sense latch array 11. Thereafter, the data is read for verification by setting the selected word line at a voltage of, e.g., 3.3 V, to judge whether or not all the data held in the sense latch array 11 are "0" (step S11) When the data "1" remains at any bit of the sense latch array 11, only the memory cells not having undergone the write operation are subjected to the write operation again by the use of the data held in the sense latch array 11 on (step S12).

By executing the steps described, data is written in the memory cells, from the one whose threshold voltage is in the lowest threshold region from the erase level as a write state, and successively the ones whose threshold voltages are higher, after which the write operation is ended. Thus, the number of word line disturbances affecting the memory cell whose threshold voltage region is the nearest to the erase level (that is, the memory cell whose threshold voltage region is the highest as a write state) can be reduced to minimize the fluctuation of the threshold voltages of the memory cells attributed to word line disturbances. Moreover, in the embodiment, the absolute values of the voltages of the write word line are gradually decreased as −11 V, −10.5 V and −10 V. Therefore, the amount of disturbance occurring in one write operation lowers gradually, so that the fluctuation of the threshold voltages can be further decreased. However, the widths of the write pulses may be gradually narrowed instead of gradually lowering the write voltages. The input operation of the addresses and data and the data write operation may be started according to an external control signal, without utilizing the command.

Figure 7:
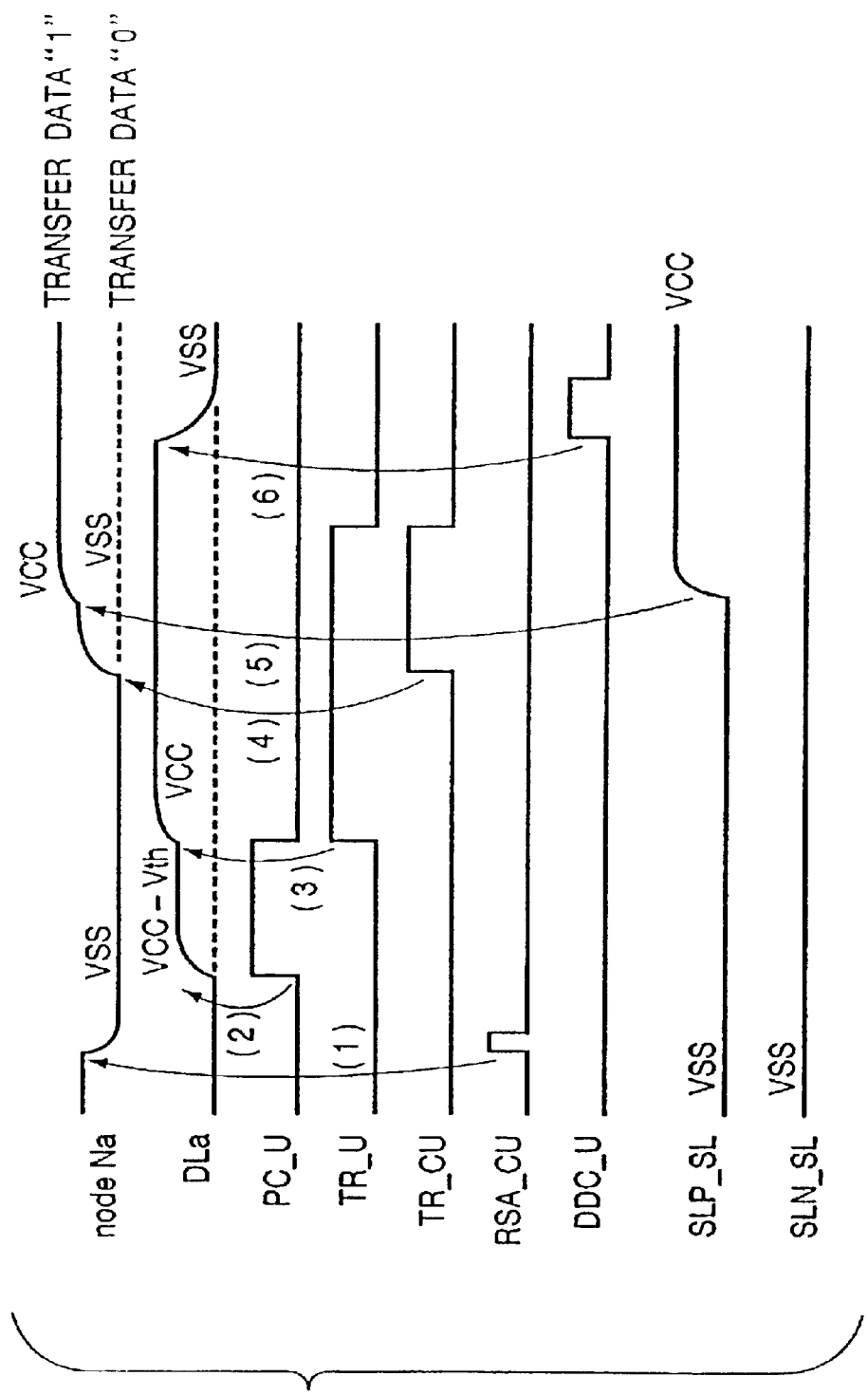
FIG. 7 is a timing chart showing the signal timings in transferring data from the data latch circuit (DLT) to the sense latch circuit (SLT)

Next, a specific example of a method for transferring the data from the data latch arrays 12a and 12b to the sense latch array 11 at the steps S5 and S9 in FIG. 6 will now be described with reference to the circuit diagram of FIG. 3 and the timing chart of FIG. 7.

(1) First, the power supply voltage of the PMOS side of the sense latch circuit SLT is set at the ground potential Vss to bring this sense latch circuit SLT into its inactive state, and a reset pulse RSA_CU is impressed on the gate of the discharging MOSFET Qd1, thereby to extract electric charges at the node Na.
(2) The gate control signal PC_U for the precharging MOSFET Qp3 of the data latch circuit DLT is brought to a high level so as to precharge the data line DLa up to a voltage (Vcc-Vth) by the use of the data held in the data latch circuit DLT.
(3) A gate control signal TR_U for the transfer MOSFET Qt2 of the data latch circuit DLT is brought to a high level so as to further precharge the data line DLa up to the voltage Vcc by the use of the data held in the data latch circuit DLT.
(4) A gate control signal TR_CU for the transfer MOSFET Qt1 on the sense latch circuit SLT side is brought to a high level so as to transfer the level of the data line DLa to the node Na.
(5) The supply voltage Vcc is fed to the PMOS side of the sense latch circuit SLT to bring this sense latch circuit SLT into an active state, thereby to definitely fix the potential of the node Na, in other words, the data held in this circuit SLT.
(6) Subsequently, the gate control signal TR_CU for the transfer MOSFET Qt1 is brought to a low level to turn off this MOSFET Qt1, and a gate control signal DDC_U for the discharging MOSFET Qd2 at the other end of the data line DLa is brought to a high level, thereby to discharge the potential of the data line DLa down to the ground potential Vss.

The operations as stated above are performed simultaneously for all the data lines, whereby the data transfer from the data latch arrays 12a and 12b to the sense latch array 11 can be effected.

Further, in the memory array of the above construction, a so-called erratic bit can be detected by a method described below, and in the case of the flash memory of this embodiment, a sequence for detecting an erratic bit and then correcting the detected erratic bit is provided. Here, the erratic bit is a bit in which data is written erroneously because the threshold voltage of a memory cell, among the memory cells on which the same write pulse has been impressed, has suddenly lowered excessively on account of an unknown cause. More specifically, it is empirically known that, in spite of the impression of a write pulse for establishing a threshold voltage corresponding to data "00" or a write pulse for establishing a threshold voltage corresponding to data "10", the threshold voltage occasionally lowers excessively and a memory cell which has a threshold voltage corresponding to data "01" is created.

Figure 8:
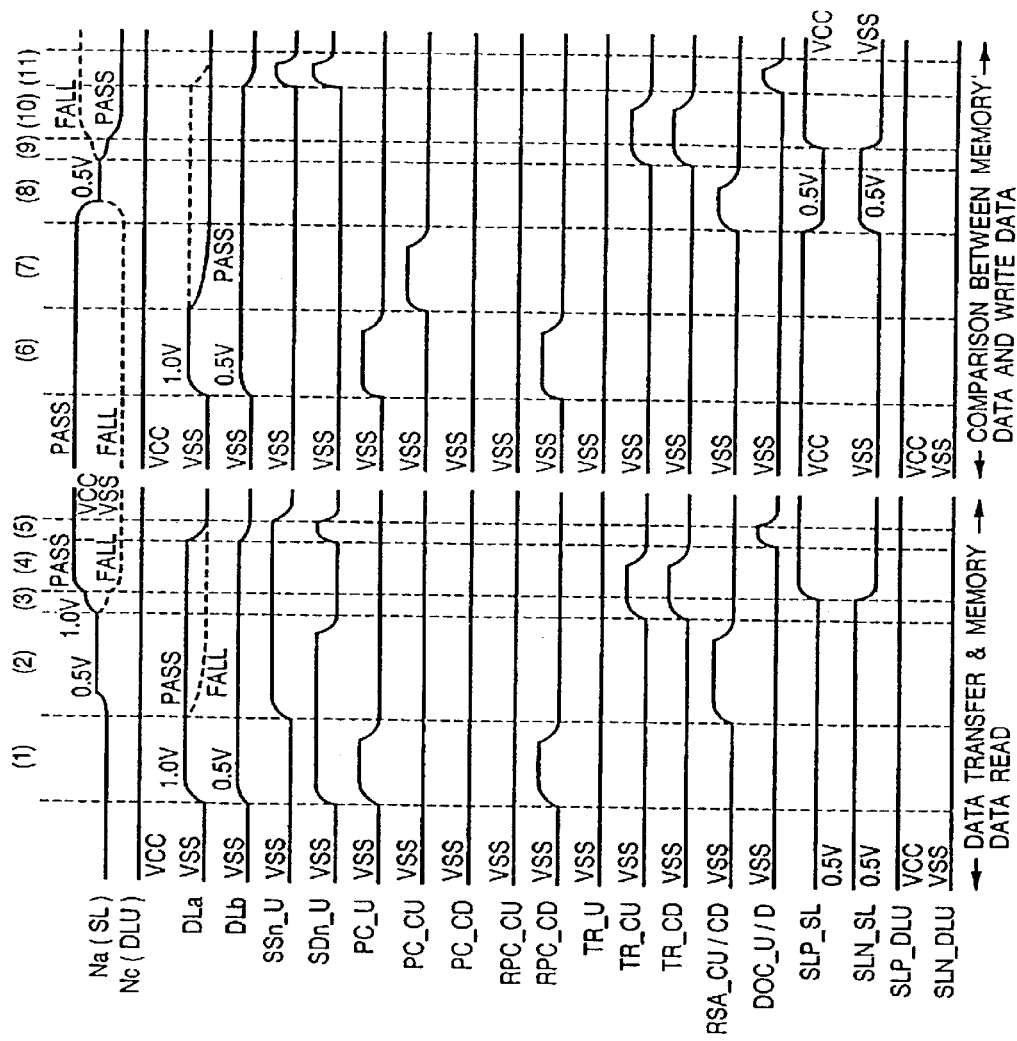
FIG. 8 is a timing chart showing the timings of the practical procedure of the detection of an erratic bit.

In this embodiment, therefore, the erratic bit is detected by a method in which, in writing data into the memory cells corresponding to the data "00" and the data "10", the write data is left in the data latch circuits, and that, after having written data, the written data being read out is fed to the sense latch circuits so as to compare it with the write data on the data lines. Specific steps for such detection will now be described with reference to FIG. 3 and FIG. 8.

(1) After having written data, each data line DLa is selectively precharged to a level of, e.g., 1.0 V by using the write data held in the data latch circuit DLT. That is, only the data line connected to the data latch circuit which holds the data "1" therein is precharged. Incidentally, each data line DLb of the mat on the opposite side is precharged to 0.5 V on this occasion.
(2) The word line to which the memory cells subjected to the write operation are connected is set at a read level lower than a target threshold voltage, whereupon written data is read. On this occasion, the memory cell which has undergone a normal write operation is in an OFF status, so that the associated data line remains unchanged at the precharge potential. In contrast, the memory cell of the erratic bit becomes into an ON state, so that the associated data line is discharged.
(3) The transfer MOSFETs Qt1 on the data lines are turned on so as to detect the levels of these data lines by the sense latch circuits SLT.
(4) The power supply voltage Vcc is fed to the sense latch circuits SLT so as to amplify the detected data line levels.
(5) The discharging MOSFETs Qd2 on the data lines are turned on so as to discharge all the data lines.
(6) Using the write data held in each data latch circuit DLT, the data line DLa is selectively precharged to the level of, e.g., 1.0 V again. The data line DLb of the mat on the opposite side is precharged to 0.5 V.
(7) The MOSFET Qc1 is selectively turned on by using the data held in each sense latch circuit SLT, and the power supply terminal corresponding thereto is set at the ground potential Vss, whereby the data line DLa is selectively discharged. In this case, the transfer MOSFET Qt1 on each data line is in an OFF state. Thus, the data line, to which the memory cell which has undergone a normal write operation is connected, is discharged, whereas the data line to which the memory cell having an erratic bit is connected is not discharged.
(8) The power supply voltage Vcc of each sense latch circuit SLT is cut off, and the discharging MOSFET Qd1 is turned on, thereby to reset the sense latch circuit SLT.
(9) The transfer MOSFET Qt1 on each data line is turned on so as to detect the level of the data line by the sense latch circuit SLT. The discharging MOSFET Qd1 is turned off.
(10) The power supply voltage Vcc is fed to each sense latch circuit SLT so as to amplify the detected data line level.

Owing to the steps described, the data "1" is held in each sense latch circuit SLT to which the memory cell having an erratic bit is connected. Accordingly, whether or not the data "1" remains in the sense latch circuit SLT is checked by a write/erase judging circuit 33, which will be described later (refer to FIG. 9), whereby the occurrence of the erratic bit can be detected and reported to the outside by erecting an error flag. Moreover, the erratic bit is brought into an erased state, and data is written into the pertinent memory cell again by the use of the data remaining in the sense latch circuit SLT, whereby erroneous data can be corrected.

By the way, since the erratic bit is due to the phenomenon in which the threshold voltage lowers excessively, the data of the memory cell of the lowest threshold voltage does not become erroneous in the read operation even in the case of an erratic bit being developed during the write operation. The reason therefor is that, when the lowest read level (1.7 V) is applied to the corresponding word line, the memory cell of the erratic bit enters into an ON state similarly to a memory cell which has undergone a normal write operation. Assuming that the threshold voltage of the erratic bit has become lower than 0 V, the read data of the pertinent memory cell becomes "1" by activating the sense latch circuit SLT with the word line held at 0 V, because this memory cell is held in an ON state. Therefore, even when the write data does not remain, the erratic bit can be detected. In the embodiment, the write operation of the memory cell of the lowest threshold voltage is first performed. Therefore, even when the write data used in the first write operation has been lost from the sense latch circuit, there is no obstruction in detecting the erratic bit.

Next, an ordinary readout operation will be described, in which the data of each memory cell is outputted to the outside of the flash memory through external terminals. Data is read by a method in which, with the word line WL activated, the potentials of the control gates of the memory cells are changed in three stages (to intermediate voltages between the threshold voltages) as in the verification operation described before, a voltage of 1 V is applied to the drain of the selected memory cell through the data line DL, and the local source line LSL is connected to the ground point. The memory cell whose threshold voltage is lower than the level of the word line is brought into an ON state, so that the data line to which this memory cell is connected is discharged to the ground potential. In contrast, the memory cell whose threshold voltage is higher than the level of the word line is brought into an OFF state, so that the data line to which this memory cell is connected is left intact at 1 V. The resulting potential of the data line is detected by the sense latch circuit SLT or the data latch circuit DLT, whereby primary read data is obtained.

More specifically, when the read operation has been started, the level of a selected word line is first set at 3.5 V so as to read data out of a selected memory cell and to hold the read data in the data latch array 12a. Subsequently, the level of the selected word line is set at 2.7 V so as to read data out of the selected memory cell and to hold the read data in the data latch array 12b. Lastly, the level of the selected word line is set at 1.7 V so as to read data out of the selected memory cell and to hold the read data in the sense latch array 11. In this way, three sorts of data are successively read out of the identical memory cell and held in the data latch arrays 12a and 12b and the sense latch array 11 by changing the word line level in the three stages. Therefore, the same read data as the written data can be restored in units of two bits by subjecting the data read to a logic operation for inverse conversion.

Table 2 below shows the stored data of the memory cell, the primary read data to be held in the latches, and the read data after the inverse conversion.

TABLE 2

| Memory Data | First Read Vwr = 3.5 V | Second Read Vwr = 2.7 V | Third Read Vwr= 1.7 V | Read I/O 0 | Data I/O 1 |
|---|---|---|---|---|---|
| 01 | 0 | 0 | 0 | 0 | 1 |
| 00 | 0 | 0 | 1 | 0 | 0 |
| 10 | 0 | 1 | 1 | 1 | 1 |
| 11 | 1 | 1 | 1 | 1 | 1 |

Incidentally, although the inverse conversion may be performed by disposing circuits for the logic operation in the data conversion circuit 20, it can also be executed by a method in which the wired logic (OR or exclusive OR) of the data held in the data latch arrays 12a and 12b and the sense latch array 11 is taken using the data lines laid in the memory array 10. The read operation is executed upon receiving a command which instructs the control circuit 32 to read data. FIG. 9 illustrates an example of the construction of the whole multivalued flash memory 1 in which the memory array 10, data conversion circuit 20 and control circuit 32 are provided on an identical semiconductor chip together with the peripheral circuits of this memory 1.

Although not especially restricted thereto, the flash memory 1 of this embodiment comprises a command decoder 31 which decodes a command given through external terminals I/O from, e.g., an external CPU, and a control circuit (sequencer) 32 which successively generates and outputs control signals for the various internal circuits of the memory 1 in order that processes corresponding to a command may be executed on the basis of the results of decoding by the command decoder 31. Thus, the flash memory 1 is so designed that, when the command is given, it is decoded so as to automatically execute the corresponding processes. The control circuit 32 is constructed of, e.g., a ROM (read-only memory) in which a series of microinstructions required to execute the command are stored, similarly to the control unit of a CPU of a microprogram system. The microprogram is started by a method in which the command decoder 31 generates the first address of the microinstructions corresponding to the command and gives them to the control circuit 32.

Figure 9:
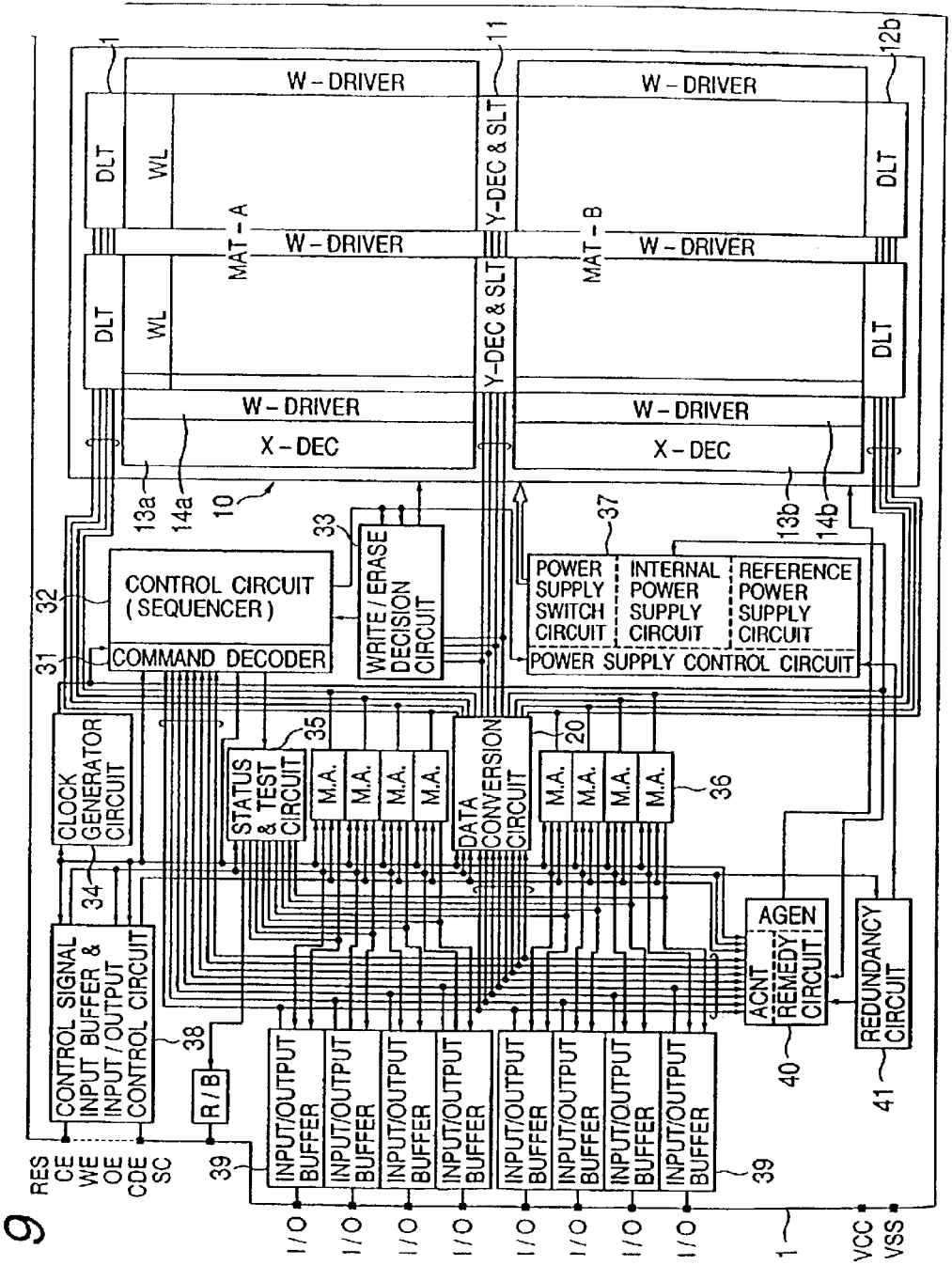
FIG. 9 is a schematic block diagram showing the whole of the embodiment of the multivalued flash memory according to the present invention.
Figure 10:
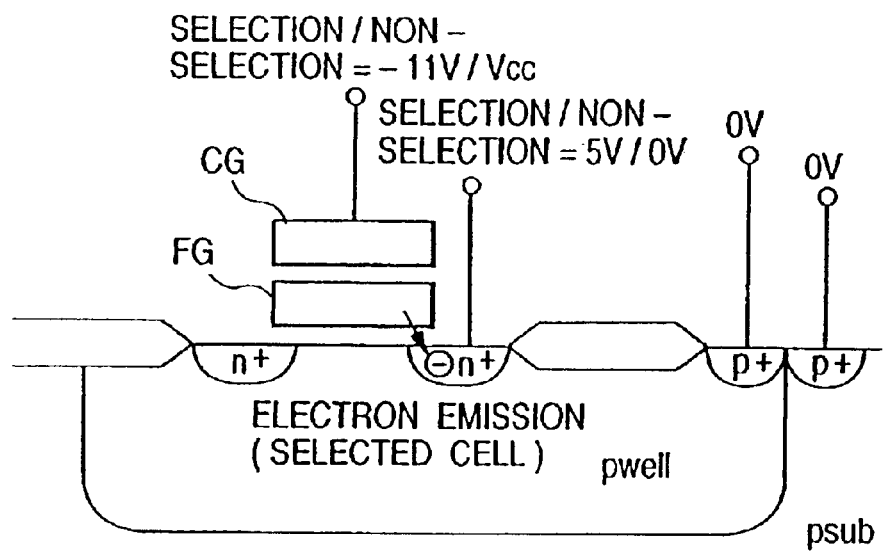
FIG. 10 is a schematic diagram showing the structure of a memory cell for use in the flash memory of the embodiment, and the voltage state in data writing operation of the memory cell.
Figure 11:
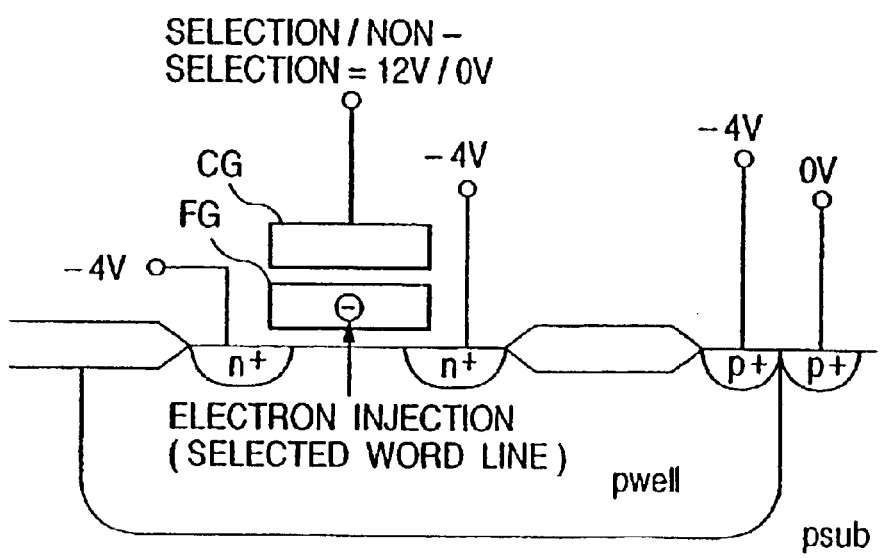
FIG. 11 is a schematic diagram showing the voltage state of the erasing operation of the memory cell for use in the flash memory of the embodiment.

In FIG. 9, circuit portions which are designated by the same symbols as in FIG. 4 designate circuits having the same functions. More specifically, numeral 10 designates the memory array which is configured of two memory mats MAT-A and MAT-B, and numeral 20 designates a data conversion circuit by which write data, which has been inputted from the outside, is converted into four-valued data for every unit of two bits. Numeral 11 designates the sense latch array for holding the converted write data and read data therein, while symbols 12a and 12b denote the data latch arrays.

The memory array 10 includes address decoders 13a and 13b of an X-system which decode address signals and then select word lines corresponding to the respective memory mats MAT-A and MAT-B, and word drive circuits 14a and 14b by which a predetermined voltage generated by and fed from an internal voltage generator circuit 37, which will be described later, is fed to one selected word line WL in each of the respective memory mats MAT-A and MAT-B in accordance with the results of the decoding by the corresponding decoders 13a and 13b. Although not especially restricted thereto, the memory array 10 of this embodiment has word drive circuits 14a and 14b arranged on both sides and at the center of the respective memory mats MAT-A and MAT-B. Although not shown in FIG. 2 nor FIG. 3, address decoder circuits of the Y-system and column switches, which are selectively turned on/off by the address decoder circuits so as to transfer the output data of the data conversion circuit 20 to the corresponding sense latches, are constructed unitarily with the sense latch array 11. In FIG. 9, the Y-system decoder circuit, column switches and sense latch circuits are illustrated as one functional block Y-DEC&SLT.

In addition to the circuits described above, the multivalued flash memory 1 of this embodiment includes the following circuits: a write/erase decision circuit 33 which functions to perform a write or erase operation to judge if the write or erase of data has ended, on the basis of the data of the sense latch array 11, and to inform the control circuit 32 of the result of this judgment so as to end a write sequence or erase sequence; a clock generator circuit 34 which generates timing clock signals necessary for the internal operations of the memory 1, and feeds the signals to the corresponding circuits in the memory 1; a status & test circuit 35 which has the function of generating and outputting a ready/busy signal R/B reflecting the internal status of the memory 1 and representing whether or not an external access is possible, to the outside of the memory 1, and the function of testing the internal circuits of the memory 1; a main amplifier circuit 36, which amplifies signals read out of the memory array 10; an internal voltage generator circuit 37 fed with the power supply voltage Vcc (3.3 V) and the ground potential Vss through power supply terminals; input/output buffer circuits 39, which receive address signals, write data signals and commands externally inputted through the external terminals I/O and then feed the signals and commands to the predetermined circuits inside the memory 1, and output read data signals outside the memory 1; a control signal input buffer & input/output control circuit 38, which receives control signals inputted from outside and then feeds them to the control circuit 32 and other predetermined circuits inside the memory 1, and controls the input/output buffer circuits 39; an address control circuit 40; and a redundancy circuit 41 for replacement with an auxiliary memory row when a defective bit is present in the memory array 10.

In the flash memory 1 of this embodiment, the external terminals (pins) I/O are shared by the address signals, write data signals and command inputs. The input/output buffer circuits 39 therefore receive these input signals in distinction from one another in accordance with control signals from the control signal input buffer & input/output control circuit 38, and then feed the signals to the predetermined internal circuits. The internal voltage generator circuit 37 includes a reference power supply circuit which generates reference voltages, such as a substrate potential, an internal power supply circuit, which is constructed of a charge pump etc. and which generates voltages required within the chip, such as a write voltage, an erase voltage, a read voltage and a verify voltage, from the basis of the externally fed power supply voltage Vcc, a power supply voltage switch circuit which selects a desired voltage from among the generated voltages in accordance with the operating status of the memory 1 and then feeds the selected voltage to the memory array 10, and a power supply control circuit which controls these circuits.

The address control circuit 40 includes an address counter ACNT, which receives the address signals externally inputted and then counts them up, an address generator AGEN, which automatically updates the Y-addresses in a data transferring operation and automatically generates X-addresses in a data erasing operation etc., and a remedy circuit which compares an input address with a defective address and which changes-over a selected memory row or column when the addresses have agreed with each other.

The control signals which are input from the external CPU or the like to the flash memory 1 of this embodiment include, for example, a reset signal RES, a chip selection signal CE, a write control signal WE, an output control signal OE, a command enable signal CDE representing if an input signal is a command, a data input or an address input, and a system clock SC.

Incidentally, as an external device for controlling the multivalued flash memory 1 of the above embodiment, any device which can facilitate an address generating function and a command generating function, such as a general-purpose microcomputer LSI (large-scale integrated circuit), can be adopted.

As thus far described, in the above embodiment, in a nonvolatile semiconductor memory device wherein a plurality of threshold voltages are set so as to store multivalued information in one memory cell, data is first written into the memory cell whose threshold voltage is the farthest from the erase level (that is, whose threshold voltage is the lowest as the written state), and data is successively written into memory cells whose threshold voltages are higher. It is therefore possible to reduce the number of word line disturbances affecting the memory cell whose threshold voltage is the nearest to the erase level and which is most susceptible to the word line disturbance. Accordingly, the embodiment brings forth the effect that the fluctuation of the threshold voltage attributed to the word line disturbance can be minimized.

Write methods of the prior art have a problem in that a write pulse is impressed on all memory cells to shift their threshold voltages, in the write operation of the first stage, so that the peak current in the write operation increases and the average power consumption increases. In contrast, in the embodiment, write pulses may be impressed on the memory cells of all different target threshold voltages. Therefore, the number of data lines which must be precharged by one writing operation and the total number of data lines which must be precharged from the start of a write operation to the end thereof can be made smaller than that of the prior-art. Accordingly, the embodiment brings forth the effect that the peak current and average power consumption of the write operations can be reduced.

Moreover, in the embodiment, the voltage of the write word line is controlled so that the absolute value thereof may decrease gradually in accordance with the target threshold voltage. Therefore, the amount of disturbance will lower gradually in one write operation, so that the fluctuation of the threshold voltages can be further reduced.

Furthermore, in the embodiment, the memory array is configured of the two mats, the data line in each mat is connected to its input/output terminal, the sense latch circuits capable of holding one bit out of 3-bit data converted by the data conversion circuit are arranged between the two mats, the data latch circuits capable of holding another bit out of the 3-bit data converted by the data conversion circuit are arranged outside the mats, and data is transferred through the data lines between the data latch circuits and the sense latch circuits. The embodiment therefore brings about the effects that any register for holding therein data resulting from the conversion need not be disposed on the data conversion circuit side, and the detection of an erratic bit is easily realized.

While the invention made by the inventors has been specifically described above in conjunction with an embodiment, it is needless to say that the present invention is not restricted to the foregoing embodiment, and it can be variously altered within a scope not departing from the purport thereof. For example, in the embodiment, the threshold voltages of memory cells are set at four levels so as to store quaternary data in one memory cell, however the present invention is also applicable to a nonvolatile memory in which the threshold voltages of memory cells are set at three levels or at five or more levels.

Besides, in the embodiment, the conversion shown in Table 1 is executed as one example of the method which converts 2-bit data into quaternary data. However, the conversion method is not restricted to the one shown in Table 1, and it may be any method as long as the data includes bits "1" at different positions. Also, the operation for the inverse conversion of data is not restricted to that of Table 2, and any inverse conversion may be adopted as long as it can restore the original 2-bit data.

Further, the method for writing data into individual memory cells is not restricted to the method of the embodiment in which, after the threshold voltages of the memory cells have been heightened once by an erase operation, they are lowered by write pulses, and it may be, e.g., a method in which the threshold voltages are heightened by write pulses. In the embodiment, the memory cell which corresponds to the sense latch circuit holding data "1" therein is subjected to a write operation so as to change the threshold voltage thereof, but the memory cell which corresponds to the sense latch circuit holding data "0" therein may be subjected to a write operation so as to change the threshold voltage thereof.

Still further, in the embodiment, the memory array is configured of two mats. However, the present invention is not restricted to this, and the invention is also applicable to a case where the memory array is divided into an even number of mats and a case where it is constructed of a single mat. In cases where the memory array is constructed of a single mat, it is possible to adopt a method in which data converted by the data conversion circuit is divided into two parts and the parts are transferred separately.

In the foregoing, the invention made by the inventors has been applied to an all-at-once erasable flash memory as the field of application of the invention. However, the present invention is not restricted to the exemplified case, but it can be extensively utilized for general nonvolatile memory devices which employ FAMOS memory elements and also for semiconductor devices which include memory cells having a plurality of threshold voltages. In addition, there is a flash memory of the NOR type wherein "erase" is defined as bringing a threshold voltage into the lowest state, while "write" is defined as heightening the threshold voltage from the erased state. When the reduction of the influence of word line disturbance in write operation is considered in the multivalued flash memory of the NOR type, the data writing operation is desirably executed for the second-lowest threshold voltage of the erased status, and subsequently for the third-lowest threshold voltage, successively executing a write operation for higher threshold voltages in this manner.

An effect which is achieved by a typical aspect of the present invention will be briefly described as follows.

The present invention can realize a nonvolatile semiconductor memory device which is capable of minimizing the fluctuation of the threshold voltages of memory cells attributed to word line disturbance, and of which the peak current and average power consumption of write operation can be reduced.

What we claim is:

1. A nonvolatile memory apparatus comprising:
   a central processing unit; and
   a nonvolatile memory,
   wherein said central processing unit is capable of outputting a plurality of commands, an address, a write enable signal, a clock signal and data,
   wherein said commands includes a program command,
   wherein said nonvolatile memory comprises a plurality of word lines and a plurality of memory cells each of which has a threshold voltage within one of a plurality of threshold voltage distributions,
   wherein one of said threshold voltage distributions is assigned to an erase state and others of said threshold voltage distributions are assigned to program states, respectively,
   wherein said nonvolatile memory receives said commands and said address during an enable state of said write enable signal and receives said data in response to said clock signal during a disable state of said write enable signal, and
   wherein in an operation of said program command, said nonvolatile memory controls selection of one word line according to said address received from said central processing unit and brings said threshold voltage of memory cells coupled to said selected word line from the erase state threshold voltage distribution to one of program state threshold voltage distributions corresponding to data to be stored in respective ones of said memory cells.

2. A nonvolatile memory apparatus according to claim 1, wherein said central processing unit is capable of outputting said commands during an enable state of a command enable signal and is capable of outputting said address during a disable state of said command enable signal.

3. A nonvolatile memory apparatus according to claim 2, wherein each of said memory cells is capable of storing a two bit data.

4. A nonvolatile memory apparatus according to claim 3, wherein said nonvolatile memory brings said threshold voltage of memory cells to be within that one of the program state threshold voltage distributions having the lowest voltage, firstly.

5. A nonvolatile memory apparatus according to claim 4, wherein said erase state is assigned to that one of said threshold voltage distributions having the highest voltage.

6. A nonvolatile memory apparatus according to claim 2, wherein said nonvolatile memory brings said threshold voltage of memory cells to be within that one of the program state threshold voltage distributions having the lowest voltage, firstly.

7. A nonvolatile memory apparatus according to claim 6, wherein said erase state is assigned to that one of said threshold voltage distributions having the highest voltage.

8. A nonvolatile memory apparatus comprising:
   a central processing unit; and
   a nonvolatile memory,
   wherein said central processing unit is capable of outputting a plurality of commands, an address, a write enable signal, a clock signal and data,
   wherein said commands includes a program command,
   wherein said nonvolatile memory comprises a plurality of I/O terminals, a plurality of word lines and a plurality of memory cells each of which has a threshold voltage within a plurality of threshold voltage distributions,
   wherein one of said threshold voltage distributions is assigned to an erase state and others of said threshold voltage distributions are assigned to program states, respectively,
   wherein said nonvolatile memory receives said commands, said address and said data via said I/O terminals, receives said commands and said address in response to a first state of said write enable signal and receives said data in response to said clock signal in a second state of said write enable signal,
   wherein in an operation of said program command, said nonvolatile memory controls selection of one word line according to said address received from said central processing unit and brings said threshold voltage of memory cells coupled to said selected word line from the erase state threshold voltage distribution to one of program state threshold voltage distributions corresponding to data to be stored in respective ones of said memory cells.

9. A nonvolatile memory apparatus according to claim 8, wherein said central processing unit is capable of outputting said commands during an enable state of a command enable signal and is capable of outputting said address during a disable state of said command enable signal.

10. A nonvolatile memory apparatus according to claim 9, wherein each of said memory cells is capable of storing a two bit data.

11. A nonvolatile memory apparatus according to claim 10, wherein said nonvolatile memory brings said threshold voltage of memory cells to be within that one of the program state threshold voltage distributions having the lowest voltage, firstly.

12. A nonvolatile memory apparatus according to claim 11, wherein said erase state is assigned to that one of said threshold voltage distributions having the highest voltage.

13. A nonvolatile memory apparatus according to claim 9, wherein said nonvolatile memory brings said threshold voltage of memory cells to be within that one of the program state threshold voltage distributions having the lowest voltage, firstly.

14. A nonvolatile memory apparatus according to claim 13, wherein said erase state is assigned to that one of said threshold voltage distributions having the highest voltage.

15. A nonvolatile memory apparatus according to claim 1, wherein said central processing unit is provided on a semiconductor substrate different from a semiconductor substrate on which said nonvolatile memory is provided.

16. A nonvolatile memory apparatus according to claim 1, wherein said central processing unit is included in a large-scale integration circuit (LSI), and wherein said LSI is coupled with terminals of said nonvolatile memory.

17. A nonvolatile memory apparatus according to claim 8, wherein said central processing unit is provided on a semiconductor substrate different from a semiconductor substrate on which said nonvolatile memory is provided.

18. A nonvolatile memory apparatus according to claim 17, wherein said central processing unit is a component in a large-scale integration circuit (LSI), said LSI includes connections with the I/O terminals of said nonvolatile memory.

19. A nonvolatile memory apparatus according to claim 8, wherein said central processing unit is included in a large-scale integration circuit (LSI), and wherein said LSI is coupled with terminals of said nonvolatile memory.

20. A nonvolatile memory apparatus according to claim 1, wherein said program command and said address commence in synchronism with a same pulse edge of successive pulses of said write enable signal, respectively.

21. A nonvolatile memory apparatus according to claim 2, wherein the enable state and the disable state of said command enable signal commence simultaneously with the program command and the data address, respectively.

22. A nonvolatile memory apparatus according to claim 8, wherein said program command and said address commence in synchronism with a same pulse edge of successive pulses of said write enable signal, respectively.

23. A nonvolatile memory apparatus according to claim 9, wherein the enable state and disable state of said command enable signal commence simultaneously with the program command and the data address, respectively.

* * * * *